(12) United States Patent
Schmidt et al.

(10) Patent No.: US 11,515,802 B2
(45) Date of Patent: Nov. 29, 2022

(54) MODULAR CONFIGURABLE INVERTER AND SYSTEMS, COMPONENTS, AND METHODS THEREOF

(71) Applicant: Caterpillar Inc., Peoria, IL (US)

(72) Inventors: Paul T. Schmidt, Washington, IL (US); Josh W. Dorothy, Dunlap, IL (US); Kyle A. Halfacre, Chillicothe, IL (US); Zachary W. Newell, Edwards, IL (US); Johnson David Sugidharan Lawrence, Chennai (IN); Saravanan Desigan, Chennai (IN)

(73) Assignee: Caterpillar Inc., Peoria, IL (US)

( * ) Notice: Subject to any disclaimer, the term of this patent is extended or adjusted under 35 U.S.C. 154(b) by 28 days.

(21) Appl. No.: 17/121,759

(22) Filed: Dec. 15, 2020

(65) Prior Publication Data

US 2022/0190736 A1 Jun. 16, 2022

(51) Int. Cl.
*H05K 7/20* (2006.01)
*H02M 7/00* (2006.01)
*H05K 5/06* (2006.01)

(52) U.S. Cl.
CPC ............ *H02M 7/003* (2013.01); *H05K 5/061* (2013.01); *H05K 7/209* (2013.01); *H05K 7/20927* (2013.01)

(58) Field of Classification Search
None
See application file for complete search history.

(56) References Cited

U.S. PATENT DOCUMENTS

| | | | |
|---|---|---|---|
| 4,578,745 A * | 3/1986 | Olsson | H01L 23/473 257/E23.098 |
| 5,631,821 A | 5/1997 | Muso | |
| 6,532,154 B2 * | 3/2003 | Eady | H05K 7/1424 363/141 |
| 7,983,044 B2 | 7/2011 | Nakamura et al. | |
| 8,081,471 B2 * | 12/2011 | Abert | H05K 7/20136 174/547 |
| 8,885,342 B2 * | 11/2014 | Skepnek | H01L 23/433 174/548 |
| 9,279,625 B2 | 3/2016 | Nakanishi et al. | |
| 10,278,305 B2 | 4/2019 | Roan et al. | |
| 10,291,145 B2 | 5/2019 | Friedlund et al. | |
| 10,945,357 B2 * | 3/2021 | Chopra | G02B 6/4261 |
| 11,218,081 B2 * | 1/2022 | Deguchi | H05K 7/20927 |
| 11,224,147 B1 * | 1/2022 | Yen | H02M 7/53871 |
| 11,239,521 B2 * | 2/2022 | Murphy | H01M 10/425 |
| 11,246,244 B2 * | 2/2022 | Denk | H02M 7/003 |

(Continued)

FOREIGN PATENT DOCUMENTS

EP 3051931 A1 8/2016
WO 2017/081255 A1 5/2017

*Primary Examiner* — Courtney L Smith

(57) ABSTRACT

A modular inverter arrangement comprising one or more cages of a cage assembly, including at least a first cage of the cage assembly. Each of the one or more cages can be in the form of a cuboid, and each of the one or more cages can be adapted to accommodate therein respective sets of one or more power modules. The modular inverter arrangement can also be comprised of a heatsink extending transversely through each of the one or more cages, from a first end of the cage assembly to a second end of the cage assembly opposite the first end.

20 Claims, 9 Drawing Sheets

(56) References Cited

U.S. PATENT DOCUMENTS

| | | | |
|---|---|---|---|
| 2016/0219743 A1* | 7/2016 | Lindblom | H05K 7/1432 |
| 2016/0353609 A1 | 12/2016 | Kakizaki et al. | |
| 2017/0237358 A1* | 8/2017 | Kraus | H05K 7/20927 |
| | | | 361/702 |
| 2020/0136554 A1* | 4/2020 | Galitev | H02S 40/34 |
| 2021/0400850 A1* | 12/2021 | Zhong | H02M 7/003 |

* cited by examiner

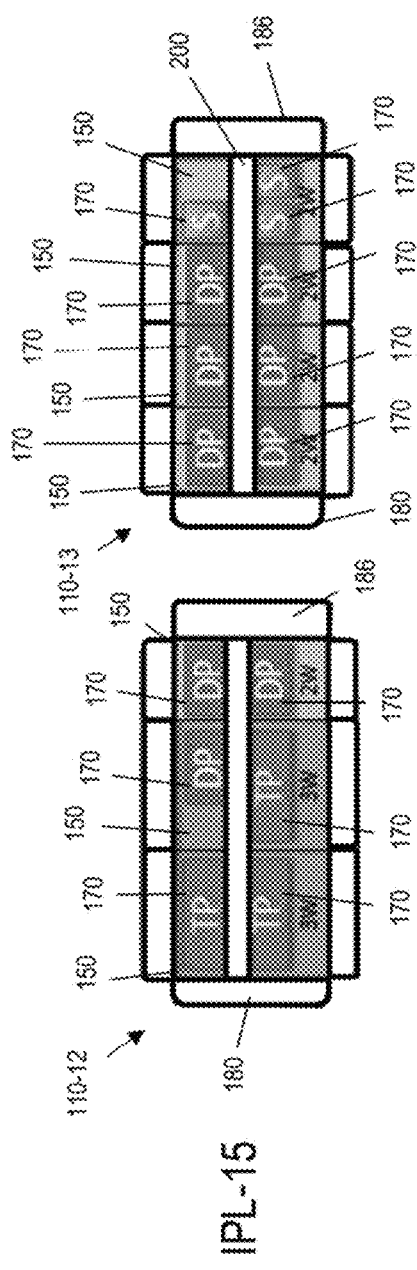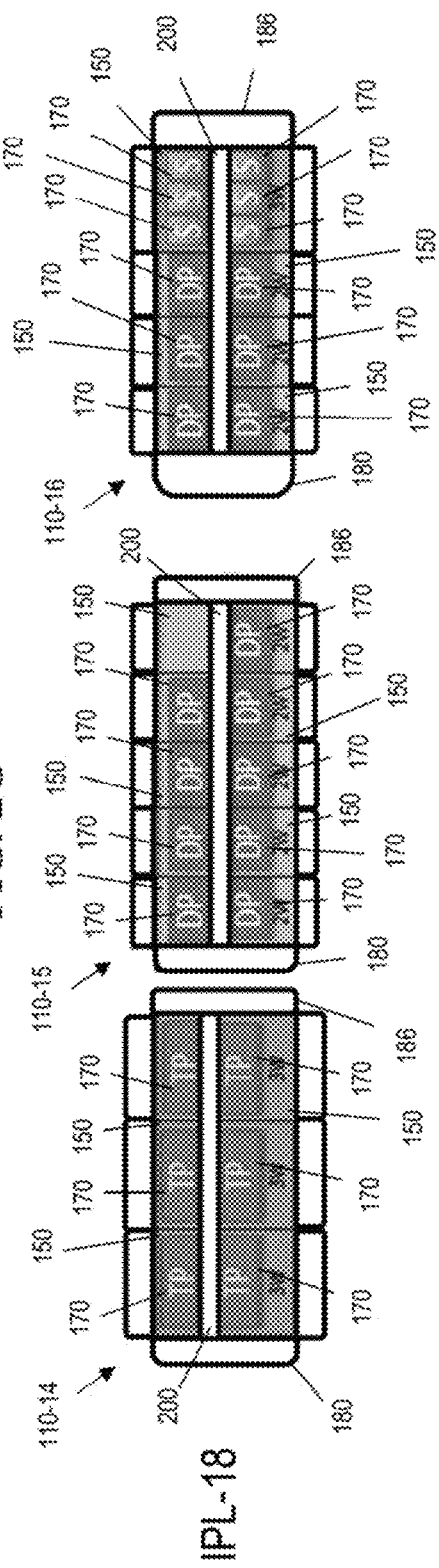

MODULAR CONFIGURABLE INVERTER AND SYSTEMS, COMPONENTS, AND METHODS THEREOF

TECHNICAL FIELD

The present disclosure relates to electrical inverters, particularly modular electrical inverters, and systems, components, and methods thereof.

BACKGROUND

In certain situations, each new electrical inverter can require a custom one-off design due to specific application, performance, and integration requirements. Hence, current electrical inverter design may eliminate cross platform volume leverage and require timely and costly research and development investments to develop multiple new electrical inverters. On the other hand, European Patent No. EP 3051931 A1 ("the EP '931 patent document") describes a modular converter housing for an electric rail vehicle. However, the EP '931 patent document is not understood to describe internal components of the modular converter housing.

SUMMARY

According to an aspect an inverter arrangement is disclosed or provided. The inverter arrangement can comprise one or more cages of a cage assembly, including a first cage of the cage assembly; a heatsink extending transversely through each of the one or more cages, from a first end of the cage assembly to a second end of the cage assembly opposite the first end; a first end cap provided at the first end of the cage assembly; and a second end cap provided at the second end of the cage assembly. Each of the one or more cages can be in the form of a cuboid. Each of the one or more cages can be adapted to accommodate therein respective sets of one or more power modules.

In another aspect, a method regarding a modular power inverter is disclosed or implemented. The method can comprise providing a cage assembly formed of at least two cages mechanically fixed to each other side-by-side in a row so as to define a first end of the cage assembly and a second end of the cage assembly opposite the first end, each of the at least two cages being in the form of a rectangular cuboid, where lengths of the at least two cages run parallel to each other and a length of the cage assembly is perpendicular to the lengths of the at least two cages; providing a heatsink extending transversely through an inner volume of each of the at least two cages, from the first end of the cage assembly to the second end of the cage assembly; providing a first set of one or more power modules operatively provided in a first cage of the at least two cages; and providing a second set of one or more power modules operatively provided in a second cage of the at least two cages. The one or more power modules of the first set and the one or more power modules of the second set can be mechanically fixed to the heatsink.

And in another aspect a modular configurable inverter assembly for a power system is disclosed or provided. The modular configurable inverter assembly can comprise a cage assembly formed of at least two cages sealingly fixed to each other side-by-side in a row so as to define a first end of the cage assembly and a second end of the cage assembly opposite the first end, each of the at least two cages being in the form of a rectangular cuboid, where lengths of the at least two cages run parallel to each other and a length of the cage assembly is perpendicular to the lengths of the at least two cages; a heatsink extending transversely through an inner volume of each of the at least two cages, from the first end of the cage assembly to the second end of the cage assembly; a first set of one or more power modules operatively provided in a first cage of the at least two cages; and a second set of one or more power modules operatively provided in a second cage of the at least two cages. The one or more power modules of the first set and the one or more power modules of the second set can be mechanically fixed to the heatsink. The heatsink can have a body that is planar, a width of the body extending in a width direction of the cage assembly and a thickness of the body extending in a height direction of the cage assembly.

Other features and aspects of this disclosure will be apparent from the following description and the accompanying drawings.

BRIEF DESCRIPTION OF DRAWINGS

FIGS. 2A-2H show exemplary modular inverter assemblies or arrangements according to embodiments of the disclosed subject matter.

DETAILED DESCRIPTION

The present disclosure relates to electrical inverters, particularly modular electrical inverters, and systems, components, and methods thereof.

Figure 1:
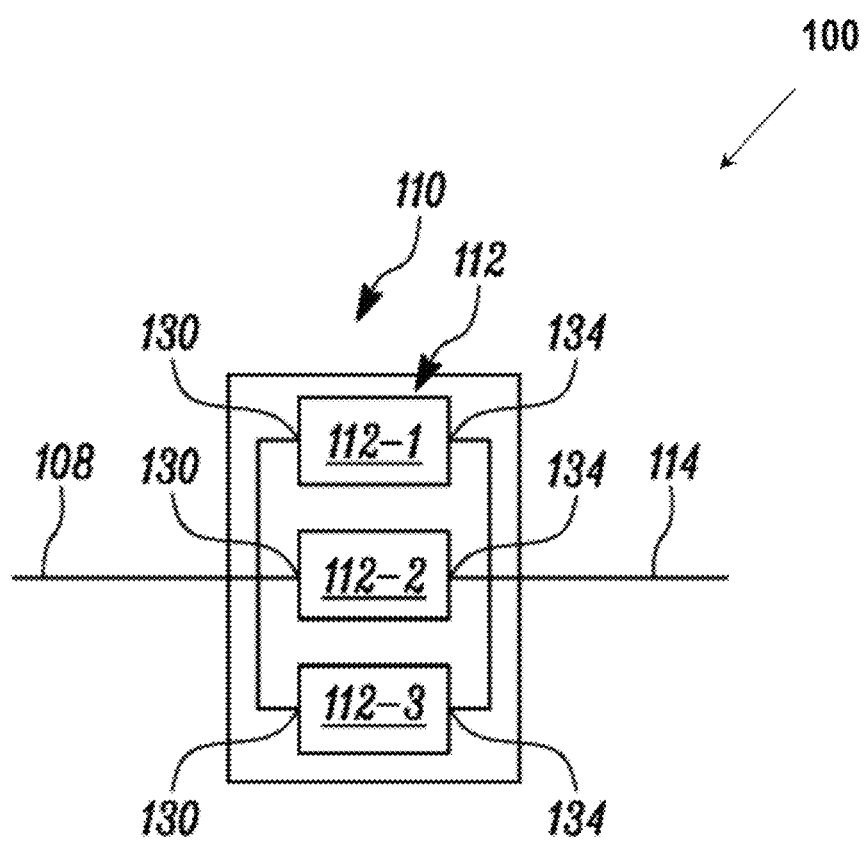
FIG. 1 is a block diagram of a power system according to one or more embodiments of the disclosed subject matter.

FIG. 1 illustrates a block diagram of a power system 100 according to one or more embodiments of the present disclosure. Generally, the power system 100 may be a power system having one or more inputs to receive AC or DC voltage and one or more outputs to output AC or DC voltage. The voltage provided to the inputs of the power system 100 may be single-phase or multi-phase. Likewise, the voltage output from the power system 100 may be single-phase or multi-phase. Multi-phase can include two-phase, three-phase, and four-phase, as examples.

The voltage input to the power system 100 can be provided from one or more power sources such as an electric generator (e.g., a three-phase electric generator), for instance, powered by an internal combustion engine, a battery (or batteries), a fuel cell (or cells), an electrical grid, etc. The voltage output from the power system 100 can be provided to one or more electrical loads such as one or more electric motors (e.g., a three-phase electric motor).

According to one or more embodiments, the power system 100 may be implemented in a machine. The machine may be characterized as a working machine and may be employed to perform various operations such as mining operations, construction operations, farming operations, transportation operations, forestry operations, material handling operations, etc. Optionally, the power system 100 may be supported on a frame of the machine. Examples of working machines include tractors, loaders, bulldozers, etc., though embodiments of the disclosed subject matter are not limited to working machines or those expressly listed.

Referring still to FIG. 1, the power system 100 can include an inverter arrangement or assembly 110. Generally, the voltage input(s) to the inverter arrangement 110 can be provided via a first power link 108 and the voltage output(s) from the inverter arrangement 110 can be provided via a second power link 114. The first power link 108 can be representative of one or more electrically conductive paths (e.g., wiring) from one or more corresponding power sources. Likewise, the second power link 114 can be representative of one or more electrically conductive paths (e.g., wiring) to one or more corresponding electrical loads.

As illustrated in FIG. 1, the inverter arrangement 110 may include a plurality of inverter units 112, individually referred to as a first inverter unit 112-1, a second inverter unit 112-2, and a third inverter unit 112-3. Embodiments of the disclosed subject matter, however, are not limited to the first, second, and third inverter units 112-1-112-3, and may include a different number of inverter units, such as less than three (e.g., only one, only two) or more than three inverter units 112 (e.g., three per phase per load). Indeed, as described herein, the inverter arrangement 110, in accordance with embodiments of the disclosed subject matter, can be configured with a suitable number of inverter units 112 to meet the specific power requirements of the particular power system 100 in which the inverter arrangement 110 is provided.

Generally, in a case where AC voltage is provided as an input to an input terminal 130 of the inverter unit 112, the inverter unit 112 may process the AC input signal to generate a suitable signal or signals for output from an output terminal 134 of the inverter unit 112. For instance, the inverter unit 112 may convert the AC input voltage into an intermediate DC value, for instance, via a rectifier, followed by further processing (e.g., pulse width modulation) to generate the suitable signal(s), such as Pulse Width Modulated (PWM) signals, for the particular electrical load. As another example, in a case where DC voltage is provided as an input to the input terminal 130, the inverter unit 112 may be driven as a so-called converter to convert the DC voltage to a suitable signal or signals for the particular electrical load (e.g., PWM signal(s)) for output via the output terminal 134 and to the second power link 114. Thus, in some embodiments, the output of the inverter unit 112 may be an AC voltage signal or signals, as noted above.

On the other hand, embodiments of the disclosed subject matter are not limited to only receiving voltage via the first power link 108 and input terminal(s) 130 of the inverter unit(s) 112 and only outputting voltage via the second power link 114 and output terminal(s) 134 of the inverter unit(s) 112. Rather, according to one or more embodiments, the second power link 114 can provide voltage signals as input to the inverter arrangement 110 and the inverter arrangement 110 can output voltage signals as output to the first power link 108.

Discussed in more detail below, each inverter unit 112 can be comprised of one or more power modules. In turn, each of the power modules may be comprised of one or more power switching devices, such as semiconductor power switching devices (e.g., Insulated Gate Bipolar Transistors (IGBTs), Metal Oxide Semiconductor Field Effect Transistors (MOSFETs), etc.). For example, each power module can be comprised of or consist of one or more pairs of semiconductor power switching devices (e.g., one or more pairs of IGBTs).

Turning to FIGS. 2A-2H, these figures show examples of modular inverter assemblies or arrangements 110 according to embodiments of the disclosed subject matter. The exemplary inverter assemblies in FIGS. 2A-2H are respectively referred to as inverter assemblies 110-1, 110-2, 110-3, 110-4, 110-5, 110-6, 110-7, 110-8, 110-9, 110-10, 110-11, 110-12, 110-13, 110-14, 110-15, and 110-16. However, embodiments of the disclosed subject matter are not limited to the examples shown in FIGS. 2A-2H.

FIGS. 2A-2H show that inverter assemblies 110 according to embodiments of the disclosed subject matter can be modular in nature and configurable on a block-by-block or cage-by-cage approach in terms of size based on power demands for a particular application. Particular application, in this context, can mean power load requirements of a particular machine, such as a working machine as described above. More specifically, the configuration of the power module(s) can be based on the specific electrical load(s) and input(s) to which the power module(s) is connected.

Inverter assemblies 110, such as those shown in FIGS. 2A-2H, can include one or more cages or blocks 150 and corresponding one or more power modules 170. Though FIGS. 2A-2H show inverter assemblies 110 with one, two, three, four, and five cages 150, embodiments of the disclosed subject matter are not so limited. That is, inverter assemblies 110 according to embodiments of the disclosed subject matter may have more than five cages 150. Each of the cages 150 can be made of aluminum and/or may be formed via casting (e.g., sand casting), for instance, as a single or unity piece (i.e., a one-piece cage). An arrangement of one or more cages 150, such as shown in FIGS. 2A-2H, may be referred to herein as a cage assembly.

Each power module 170 can be characterized as single parallel (S), double parallel (DP), or triple parallel (TP), where single parallel S will hereinafter be referred to as single parallel (SP). In this regard, single parallel SP can mean one switching device (e.g., IGBT) per phase, double parallel DP can mean two switching devices (e.g., IGBTs) per phase, and triple parallel TP can mean three switching devices (e.g., IGBTs) per phase.

FIGS. 2A-2H show the inverter assemblies 110 grouped according to number of power modules 170. In particular, IPL-3 can refer to three power modules 170 per inverter assembly 110, IPL-4 can refer to four power modules 170 per inverter assembly 110, IPL-6 can refer to six power modules 170 per inverter assembly 110, IPL-8 can refer to eight power modules 170 per inverter assembly 110, IPL-9 can refer to nine power modules 170 per inverter assembly 110, IPL-12 can refer to twelve power modules 170 per inverter assembly 110, IPL-15 can refer to fifteen power modules 170 per inverter assembly 110, and IPL-18 can refer to eighteen power modules 170 per inverter assembly 110.

Discussed in more detail below, each inverter assembly 110 can also have a first end cap or plate 180, a second end cap or plate 186, and a heatsink 200. Also discussed in more detail below, each inverter assembly 110 can have one or more power connection interface panels, one or more panel arrangements, and one or more capacitors associated with each cage 150. Optionally, such capacitor(s) can be considered part of the inverter assembly 110.

As shown in FIGS. 2A-2H, the heatsink 200 can extend through (e.g., transversely) all of the cages 150 of the inverter assembly 110. Furthermore, the heatsink 200 may extend to opposite ends of a single cage 150 in the case of a single-cage 150 cage assembly embodiment or to opposite ends of a multiple-cage 150 cage assembly embodiment. According to one or more embodiments, the heatsink 200 can extend to the first end plate 180 and/or the second end plate 186. Optionally, opposite ends of the heatsink 200 can be mechanically fixed to the first end plate 180 and/or the second end plate 186. Also shown in FIGS. 2A-2H, each power module 170 can be provided on the heatsink 200. For instance, each power module 170 can be mechanically coupled or fixed to the heatsink 200 via one or more fasteners, adhesives, etc., including combinations.

According to one or more embodiments, the inverter assembly 110 can be sealed to prevent or minimize external substances such as water and/or dust from entering an internal volume or space of the inverter assembly 110. That is, all external surfaces of the inverter assembly 110 can be sealed to the external environment. Such sealing can be according to IP67, as an example, to prevent water and/or dust from gaining access to the inside of the inverter assembly 110. Regarding sealing, the first end plate 180, the second end plate 186, the plurality of power connection interface panels, and the one or more capacitors can be sealingly connected to their respective cage(s) 150 via one or more fasteners, adhesives, O-rings, gaskets, etc., including combinations.

Turning back to the modular and configurable aspect of inverter assemblies 110 according to embodiments of the disclosed subject matter, as illustrated in FIGS. 2A-2H, each cage 150 can receive and house one or more power modules 170 of the same type (e.g., all SPs, all DPs, or all TPs) or of different types (e.g., SPs and DPs, SPs and TPs, etc.). Additionally, according to one or more embodiments, the cages 150 can come in different sizes, for instance, a so-called double-size cage and a so-called triple-size cage. Double-size and triple-size in this context can mean the overall maximum number of power parallel configurations for the power modules 170 in a width direction of the cage 150. For instance, for a double-size cage 150 a maximum of either two adjacent SP power modules 170 or a single DP power module 170 can be implemented in the width direction of the cage 150 (for each of the opposing mounting surfaces of the heatsink 200). A TP power module 170 may not be implemented in the double-size cage 150 according to embodiments of the disclosed subject matter. Thus, the internal volumes defined by the cages 150 can be different. For instance, the width of double-size cage 150 can be less than the width of the triple-size cage 150 (optionally, the length and/or height of the double-size and triple-size cages 150 can be the same). Though double- and triple-size cages 150 are discussed above, embodiments of the disclosed subject matter can involve more than these two sizes of cages 150.

The size and number of the cage(s) 150 and the type and number of the power modules 170 per cage 150 can be selected for a particular configuration for the inverter assembly 110 according to the power requirements for the particular electrical load or loads, as noted above. Exemplary inverter assemblies 110-1, 110-2, 110-3, 110-4, 110-5, 110-6, 110-7, 110-8, 110-9, 110-10, 110-11, 110-12, 110-13, 110-14, 110-15, and 110-16 from FIGS. 2A-2H are discussed in more detail below. Each of the inverter assemblies 110-1, 110-2, 110-3, 110-4, 110-5, 110-6, 110-7, 110-8, 110-9, 110-10, 110-11, 110-12, 110-13, 110-14, 110-15, and 110-16 can be mounted or otherwise provided according to a horizontal orientation or a vertical orientation. As illustrated in FIGS. 2A-2H, inverter assemblies 110 accord to embodiments of the disclosed subject matter can include a single cage 150 (e.g., a single triple-size cage or a single double-size cage), multiple cages 150 of the same size (e.g., all double-size or all triple-size cages), or multiple cages 150 where at least one of the cages 150 is of a different size (e.g., one double-size cage and one triple-size cage).

Turning to the exemplary inverter assemblies shown in FIGS. 2A-2H, inverter assembly 110-1 can provide a 1 over 2 power arrangement with a double-size cage 150, one SP power module 170 on one mounting surface of the heatsink 200, and two SP power modules 170 on the opposite mounting surface of the heatsink 200. The single double-size cage 150 may be referred to as a cage assembly.

Inverter assembly 110-2 can provide a 2 over 2 power arrangement with a double-size cage 150 and two SP power modules 170 on each of the opposing mounting surfaces of the heatsink 200. The single double-size cage 150 may be referred to as a cage assembly.

Inverter assembly 110-3 can provide a 3 over 3 power arrangement with a triple-size cage 150 and three SP power modules 170 on each of the opposing mounting surfaces of the heatsink 200. The single triple-size cage 150 may be referred to as a cage assembly.

Inverter assembly 110-4 can provide a 4 over 4 power arrangement with two double-size cages 150. The two double-size cages 150 can be mechanically coupled together (e.g., via fasteners) in side-by-side fashion to form a row of cages 150 and hence a cage assembly. Each cage 150 can have one DP power module 170 on each of the opposite mounting surfaces of the heatsink 200. Thus, two DP power modules 170 can be on each mounting surface of the heatsink 200.

The inverter assembly 110-5 can provide a 5 over 4 power arrangement with a double-size cage 150 and a triple-size cage 150 mechanically coupled together (e.g., via fasteners) in side-by-side fashion to form a row of cages 150 and hence a cage assembly. The double-size cage 150 can have two DP power modules 170, one each on opposite mounting surfaces of the heatsink 200, and the triple-size cage 150 can have a set of three SP power modules 170 and one DP power module 170 on opposite mounting surfaces of the heatsink 200.

Figure 2A:
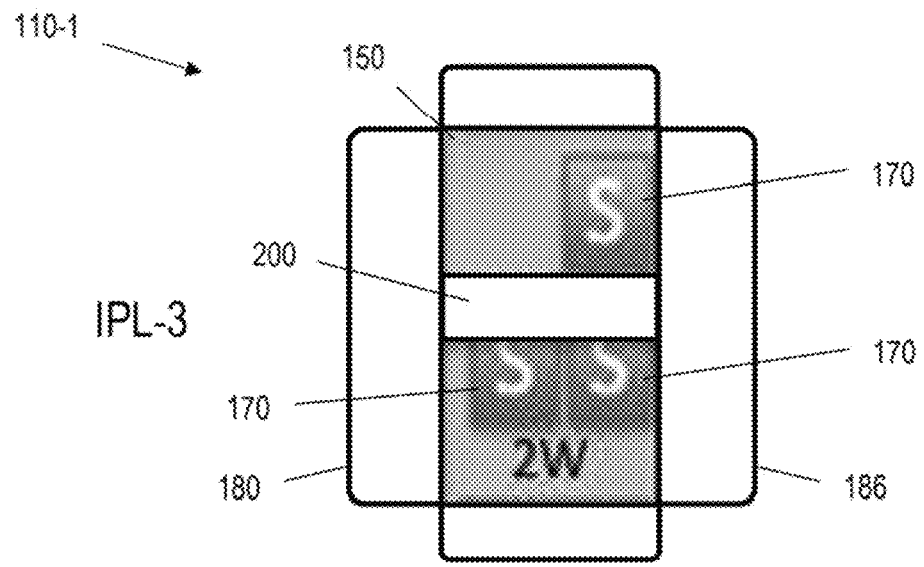
Figure 2B:
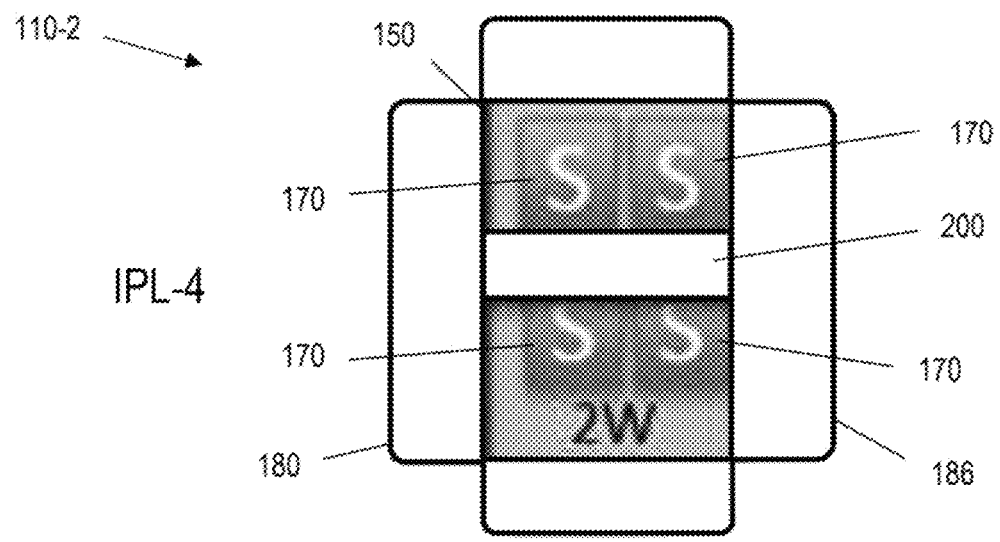
Figure 2C:
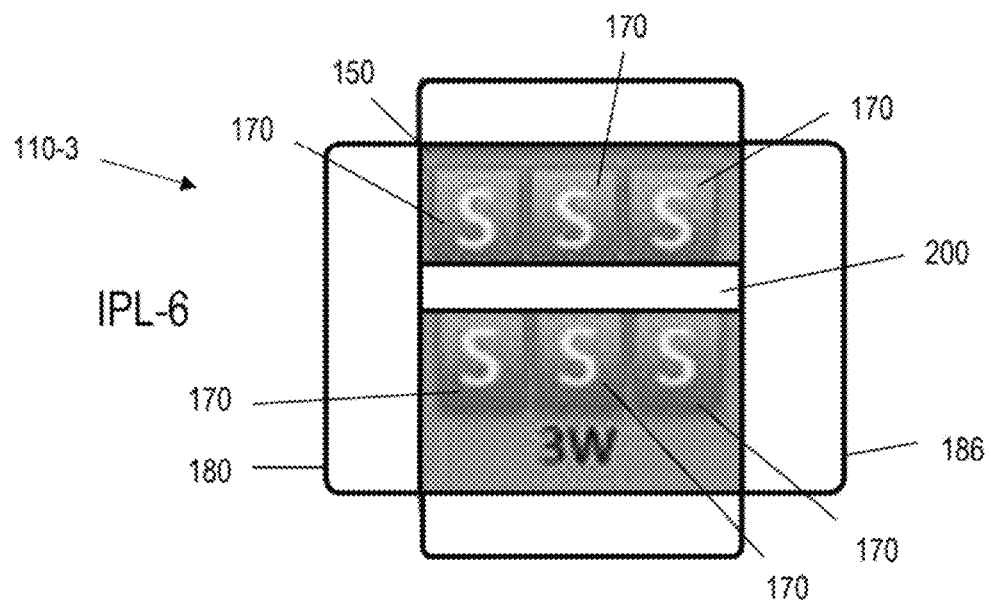
Figure 2D:
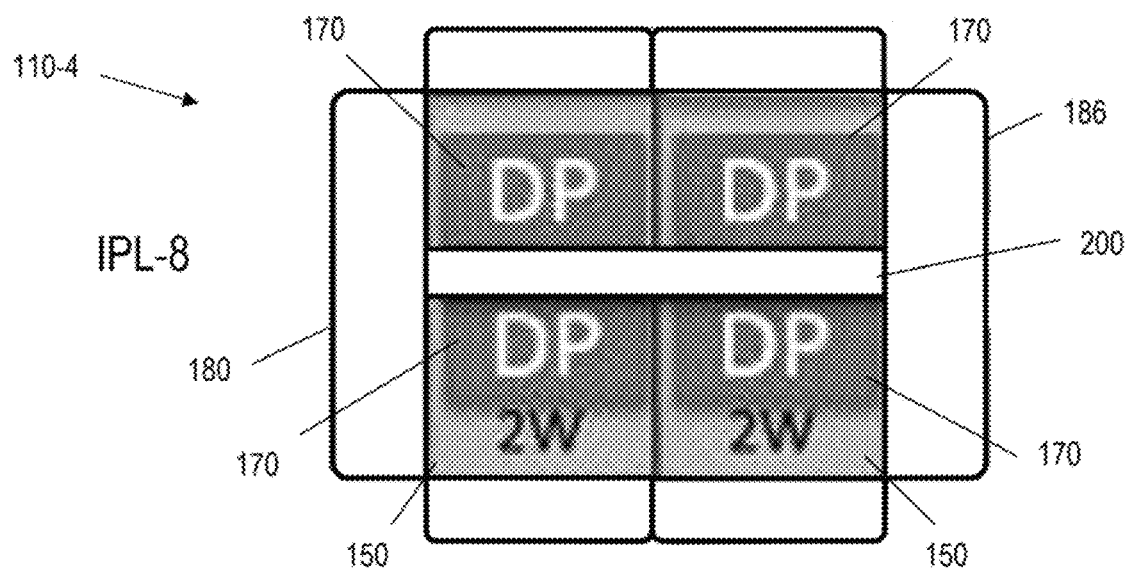
Figure 2E:
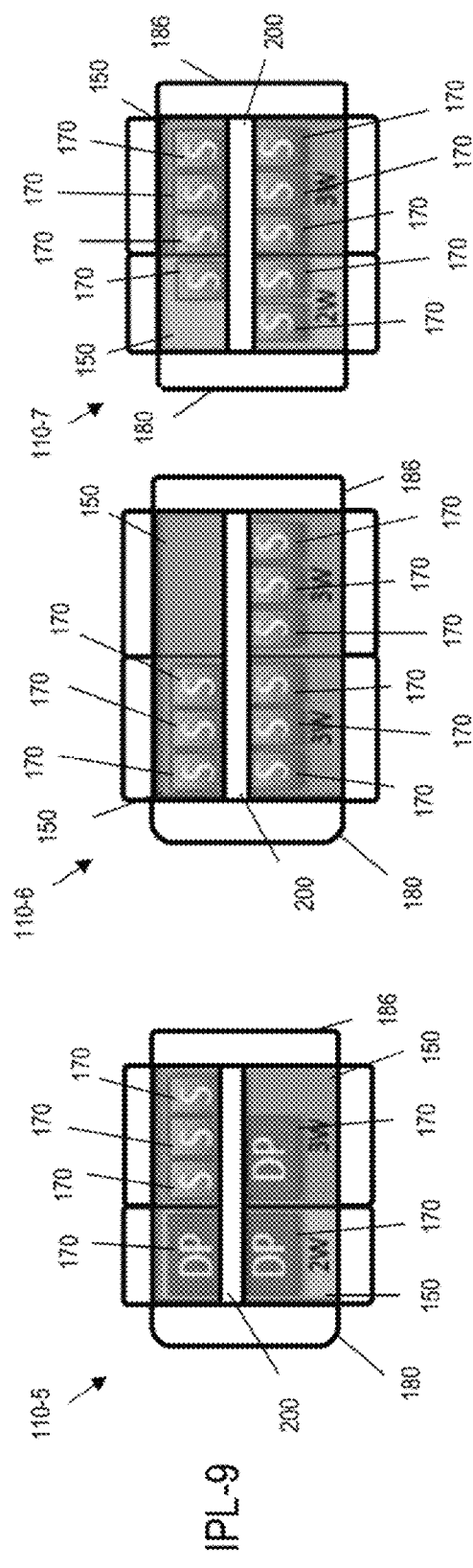
Figure 2F:
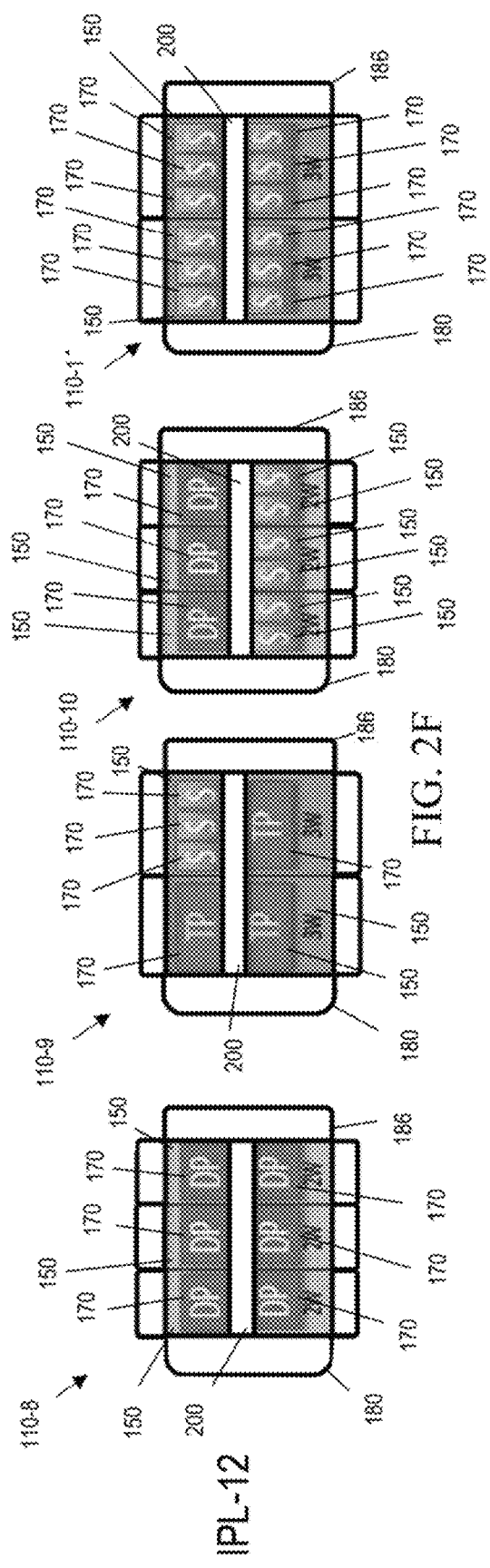

The inverter assembly 110-6 can provide a 6 over 3 power arrangement with two triple-size cages 150 mechanically coupled together (e.g., via fasteners) in side-by-side fashion to form a row of cages 150 and hence a cage assembly. The left triple-size cage 150 can have a set of three SP power modules 170 on each of the opposite mounting surfaces of the heatsink 200, and the right triple-size cage 150 can have a set of three SP power modules 170 on one mounting surface of the heatsink 200 and no power modules on the opposite mounting surface of the heatsink 200, such as shown in FIG. 2E.

The inverter assembly 110-7 can provide a 5 over 4 power arrangement with a double-size cage 150 and a triple-size cage 150 mechanically coupled together (e.g., via fasteners) in side-by-side fashion to form a row of cages 150 and hence a cage assembly. The triple-size cage 150 can have a set of three SP power modules 170 on each opposite mounting surface of the heatsink 200, and the double-size cage 150 can have one SP power module 170 on one mounting surface of the heatsink 200 and two SP power modules 170 on the opposite mounting surface of the heatsink 200.

The inverter assembly 110-8 can provide a 6 over 6 power arrangement with three double-size cages 150 mechanically coupled together (e.g., via fasteners) in side-by-side fashion to form a row of cages 150 and hence a cage assembly. Each double-size cage 150 can have a DP power module 170 on each of opposite mounting surfaces of the heatsink 200.

The inverter assembly 110-9 can provide a 6 over 6 power arrangement with two triple-size cages 150 mechanically coupled together (e.g., via fasteners) in side-by-side fashion to form a row of cages 150 and hence a cage assembly. The left triple-size cage 150 can have two TP power modules 170, one each on opposite mounting surfaces of the heatsink 200, and the right triple-size cage 150 can have a set of three SP power modules 170 on one mounting surface of the heatsink 200 and a TP power module 170 on the opposite mounting surface of the heatsink 200.

The inverter assembly 110-10 can provide a 6 over 6 power arrangement with three double-size cages 150 mechanically coupled together (e.g., via fasteners) in side-by-side fashion to form a row of cages 150 and hence a cage assembly. Each of the double-size cages 150 can have a DP power module 170 on one mounting surface of the heatsink 200 and a set of two SP power modules 170 on the opposite mounting surface of the heatsink 200.

The inverter assembly 110-11 can provide a 6 over 6 power arrangement with two triple-size cages 150 mechanically coupled together (e.g., via fasteners) in side-by-side fashion to form a row of cages 150 and hence a cage assembly. Each of the triple-size cages 150 can have a set of three SP power modules 170 on one mounting surface of the heatsink 200 and a set of three SP power modules 170 on the opposite mounting surface of the heatsink 200.

The inverter assembly 110-12 can provide an 8 over 7 power arrangement with a double-size cage 150 and two triple-size cages 150 mechanically coupled together (e.g., via fasteners) in side-by-side fashion to form a row of cages 150 and hence a cage assembly. In this example, the two triple-size cages 150 can be next to each other, such as shown in FIG. 2G, though embodiments of the disclosed subject matter are not so limited. The left triple-size cage 150 can have one TP power module 170 on each of the opposite mounting surfaces of the heatsink 200, the middle triple-size cage 150 can have a DP power module 170 on one mounting surface of the heatsink 200 and a TP power module 170 on the opposite mounting surface of the heatsink 200, and the double-size cage 150 can have one DP power module 170 on each of the opposite mounting surfaces of the heatsink 200.

The inverter assembly 110-13 can provide an 8 over 7 power arrangement with four double-size cages 150 mechanically coupled together (e.g., via fasteners) in side-by-side fashion to form a row of cages 150 and hence a cage assembly. The right double-size cage 150 can include one SP power module 170 on one mounting surface of the heatsink 200 and two SP power modules 170 on the opposite mounting surface of the heatsink 200. The remaining double-size cages 150 can each include one DP power module 170 on each of the opposite mounting surfaces of the heatsink 200.

The inverter assembly 110-14 can provide a 9 over 9 power arrangement with three triple-size cages 150 mechanically coupled together (e.g., via fasteners) in side-by-side fashion to form a row of cages 150 and hence a cage assembly. Each of the triple-size cages 150 can have a TP power module 170 on each of the opposite mounting surfaces of the heatsink 200. The inverter assembly 110-14 can be mounted according to a vertical orientation whereby the length of the inverter assembly 110-14 runs vertically. As an example, the inverter assembly 110-14 can be mounted vertically on a working machine.

The inverter assembly 110-15 can provide a 10 over 8 power arrangement with five double-size cages 150 mechanically coupled together (e.g., via fasteners) in side-by-side fashion to form a row of cages 150 and hence a cage assembly. The right double-size cage 150 can include one DP power module 170 on one mounting surface of the heatsink 200 and no power modules 170 on the opposite mounting surface of the heatsink 200. The remaining double-size cages 150 can include one DP power module 170 on each of the opposite mounting surfaces of the heatsink 200. The inverter assembly 110-15 can be mounted according to a vertical orientation whereby the length of the inverter assembly 110-15 runs vertically. As an example, the inverter assembly 110-15 can be mounted vertically on a working machine.

The inverter assembly 110-16 can provide a 9 over 9 power arrangement with three double-size cages 150 and one triple-size cage 150 mechanically coupled together (e.g., via fasteners) in side-by-side fashion to form a row of cages 150 and hence a cage assembly. In this example, the double-size cages 150 can be next to each other, such as shown in FIG. 2H, though embodiments of the disclosed subject matter are not so limited. Each of the double-size cages 150 can have a DP power module 170 on each of the opposite mounting surfaces of the heatsink 200, and the triple-size cage 150 can have three SP power modules 170 on each of the opposite mounting surfaces of the heatsink 200. The inverter assembly 110-16 can be mounted according to a vertical orientation whereby the length of the inverter assembly 110-16 runs vertically. As an example, the inverter assembly 110-16 can be mounted vertically on a working machine.

Figure 3:
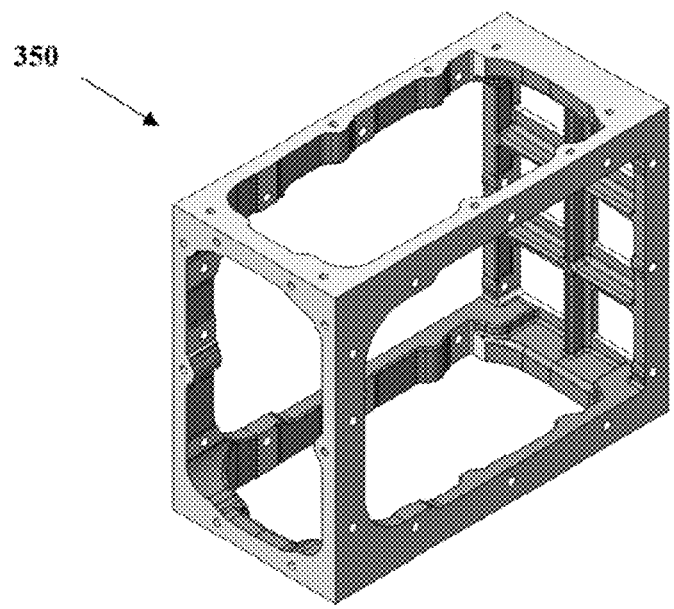
FIG. 3 is a perspective view of an individual cage or block of a cage arrangement according to one or more embodiments of the disclosed subject matter.

Turning now to FIG. 3, FIG. 3 shows a block or cage 350 according to embodiments of the disclosed subject matter. Cage 350 may correspond to at least some of the cages 150 discussed above. Here, the cage 350 can be representative a double-size cage, such as described above. Cages 150 according to embodiments of the disclosed subject matter can be in the form of a hollow geometric frame, for instance, a cuboid. For example, the cage 350 of FIG. 3 may be characterized as being in the form of a rectangular cuboid. Thus, cuboid, as used herein, can mean or include cube-shaped, substantially cube-shaped, rectangular-shaped, or substantially rectangular-shaped, at least for the outer profile of the cage 150.

Cage 350 can be in the form of a frame with at least one opening per side or face. In FIG. 3, cage 350 has one opening for each of the front, left, right, top, and bottom sides and a plurality of openings for the rear side (as defined according to the orientation of FIG. 3). As shown, the openings for each of the front, left, right, top, and bottom sides can be greater than the openings of the rear side. Optionally, the openings of the rear side can be the same size (shape and dimension).

Discussed in more detail below, the rear side of the cage 350 can be adapted to have mechanically coupled thereto (and optionally sealing coupled thereto) a plurality of capacitors, for instance, in one-to-one correspondence with the openings in the rear side, such that the capacitors extend from the rear side of the cage 350. The plurality of openings can allow for the electrical connection between terminals or leads of the capacitors and the internal components of the cage 350, such as the power modules 170 and associated circuitry (e.g., internal bus structures, etc.). The lattice structure of the rear side, which can be formed by intersecting ribs, can be to provide structural integrity and rigidity for the cage 350. In this example, at least some of the windows or openings in the rear side of the cage 350 can be used to access mechanically affixed joints (e.g., mechanically bolted joint) for the coupling and/or decoupling of the cage 350 to another cage 150 (e.g., cage 350) and/or an end plate, such as first end plate 180 and/or second end plate 186.

Figure 4:
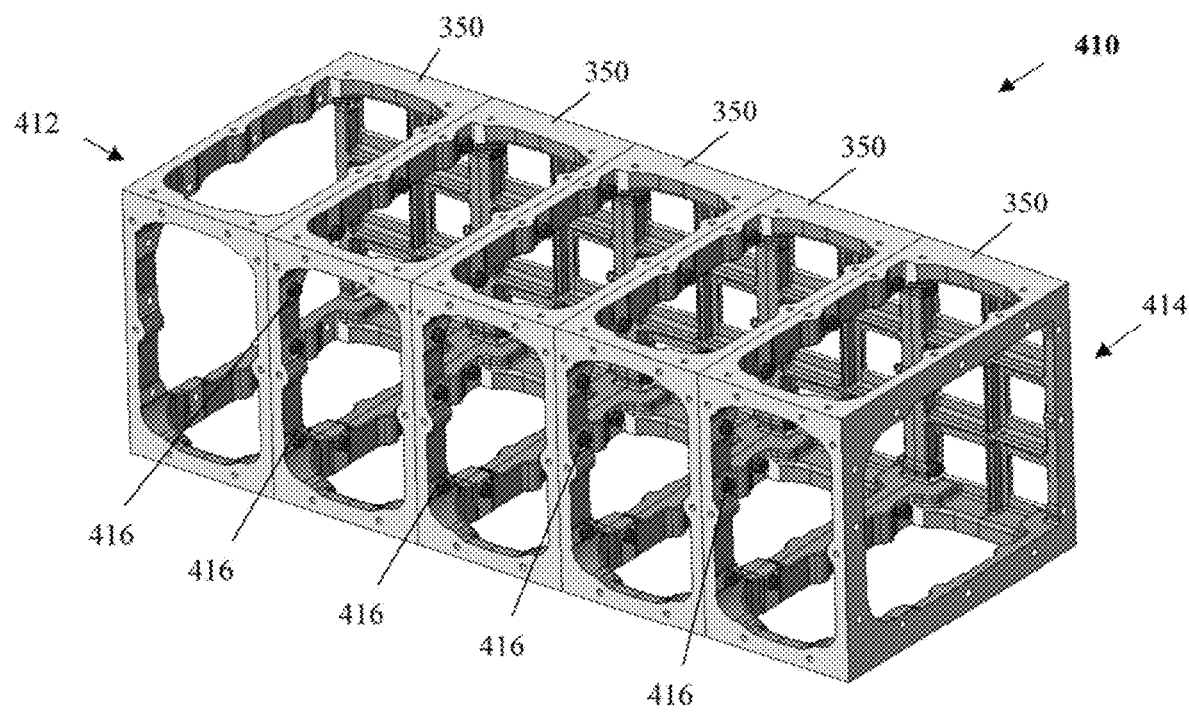
FIG. 4 is a perspective view of a cage assembly according to one or more embodiments of the disclosed subject matter.

Referring now to FIG. 4, this figure shows a cage assembly 410 according to embodiments of the disclosed subject matter. Notably, cage assembly 410 can be comprised of a plurality cages, in this case, five of the cages 350. Hence, in this example, all of the cages 350 can have the same dimensions. Cage assembly 410 may be representative of an underlying cage assembly of the inverter assembly 110-15 of FIG. 2H. Incidentally, cages, such as cages 350, can be mechanically coupled together as shown in FIG. 4 prior to providing additional components or features therein or thereon, such as the heatsink 200, the power modules 170, the capacitors, the first end plate 180, the second end plate 186, etc.

As shown in FIG. 4, the cages 350 can be mechanically fixed to each other side-by-side in a row so as to define a first end 412 of the cage assembly 410 and a second end 414 of the cage assembly 410 opposite the first end 412. As noted above, adjacent cages 350 can be sealingly fixed to each other. That is, a seal can be provide between adjacent sides of adjacent cages 350. Also shown in FIG. 4, adjacent cages 350 can be mechanically fixed to each other via a plurality of fasteners 416. As an example, the fasteners 416 can be nut and bolt pairs (and optionally washers).

Some or all of the cages 350 can be arranged according to the same orientation (e.g., rear sides on same side of cage assembly 410). FIG. 4 also shows that the lengths of the cages 350 can run parallel to each other and a length of the cage assembly 410 can be perpendicular to the lengths of the cages 350.

Figure 5:
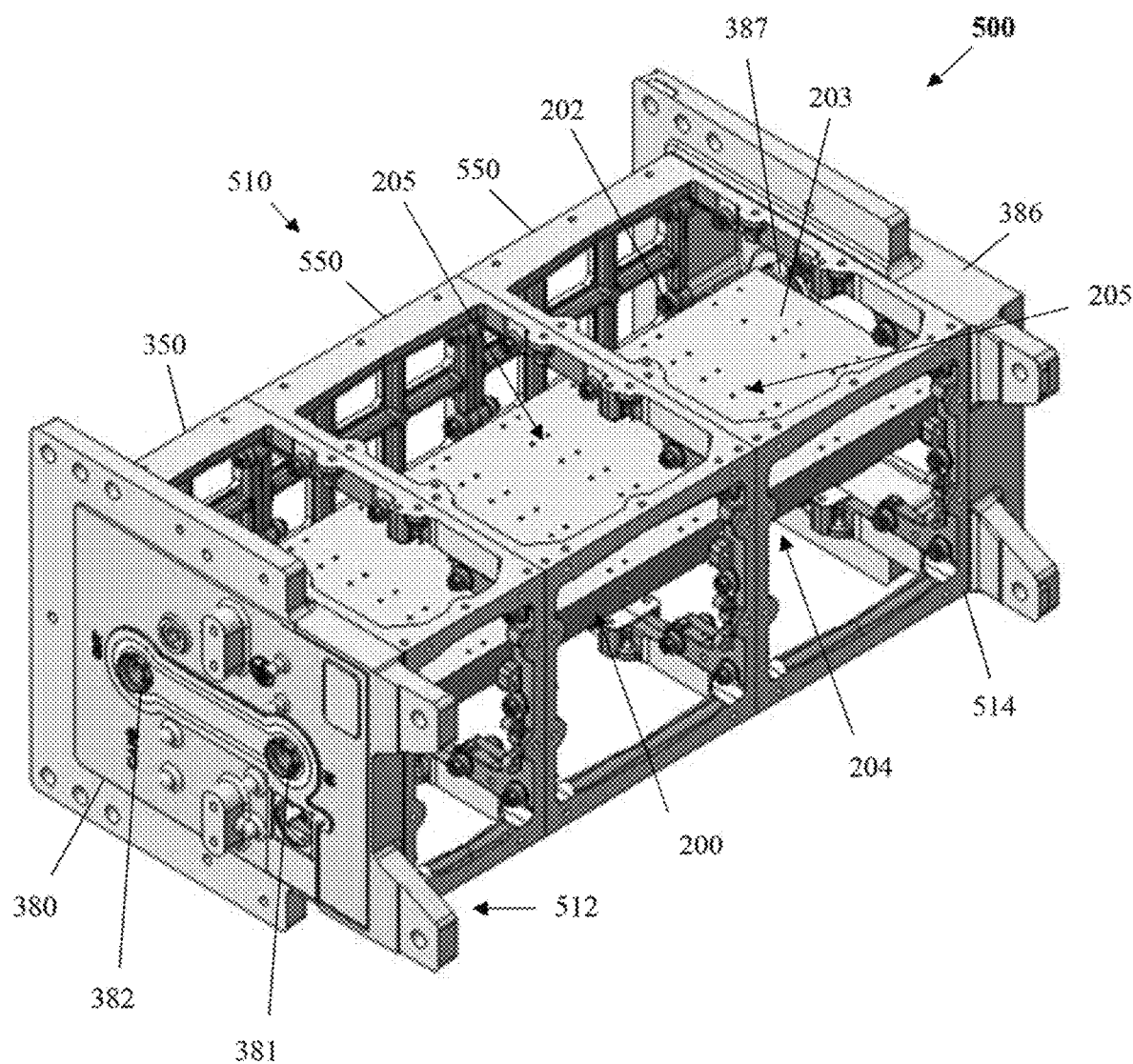
FIG. 5 is a perspective view of a portion of an inverter assembly or arrangement according to embodiments of the disclosed subject matter.

FIG. 5 shows an inverter assembly 500 with a variation of a cage assembly 510 according to embodiments of the disclosed subject matter. In this example, the cage assembly 510 can have cages of different sizes. For instance, cage assembly 510 can have one cage 350 and two cages 550 of same size mechanically fixed to each other side-by-side in a row so as to define a first end 512 of the cage assembly 510 and a second end 514 of the cage assembly 510 opposite the first end 512. Here, the cage 350 can be representative a double-size cage and the cages 550 can be representative of a triple-size cage, such as described above. Thus, the cage 350 and the cages 550 can have different widths but the same length and height. Cage assembly 510 may be representative of an underlying cage assembly of the inverter assembly 110-12 of FIG. 2G.

Also shown in FIG. 5, a first end cap or plate 380 can be mechanically coupled (and optionally sealingly coupled) to the first end 512 of the cage assembly 510 and a second end cap or plate 386 can be mechanically coupled (and optionally sealingly coupled) to the second end 514 of the cage assembly 510. First end plate 380 and second end plate 386 can respectively correspond to the first end plate 180 and the second end plate 186 discussed above. According to one or more embodiments, such end plates can be castings. Additionally, though the first end plate 380 and the second end plate 386 are expressly shown for cage assembly 510, such end plates can be similarly provided for cage assembly 410 of FIG. 4.

The first end plate 380 can have or otherwise present a plurality of coolant ports, particularly a coolant input port 381 and a coolant output port 382. Discussed in more detail below, some or all of the coolant input port 381 and/or the coolant output port 382 may be part of the heatsink 200. In this regard, the coolant input port 381 and/or the coolant output port 382 may merely extend through respective opening portions of the first end plate 380. Alternatively, the first end plate 380 may provide some sort of coupling interface, such as a threaded, quick-connect, or snap-fit receptacle, for removably coupling coolant conduits (e.g., hoses) to the coolant input port 381 and the coolant output port 382. The second end plate 386 can have a coolant drain port 387 (and optional plug or valve). Similarly, some or all of the coolant drain port 387 may be part of the heatsink 200. In this regard, the coolant drain port 387 may merely extend through an opening of the second end plate 386. Alternatively, the second end plate 386 may provide some sort of coupling interface, such as a threaded or snap-fit receptacle, for removably coupling a plug or cap over the coolant drain port 387. Optionally, the first end plate 380 and/or the second end plate 386 can have additional connections or ports, such as an MS electrical connector to perform diagnostics.

The heatsink 200, which may be an extrusion, can have a body 202 that is planar, such as shown in FIG. 5. A width of the body 202 can extend in a width direction of the cage assembly 510 and a thickness of the body 202 can extend in a height direction of the cage assembly 510. A length of the body 202 can extend in a length direction of the inverter assembly 500.

The body 202 of the heatsink 200 can have a first mounting surface 203 and a second mounting surface 204 opposite the first mounting surface 203. Each of the first mounting surface 203 and the second mounting surface 204 can include a plurality of mounting interfaces 205. One or more power modules 170 can be mounted to each of the first mounting surface 203 and/or the second mounting surface 204 as described herein. For instance, the mounting interfaces 205 can be holes or openings in the body 202 of the heatsink 200 adapted to receive mounting pins or the like of corresponding power modules 170.

As noted above, the heatsink 200 can form all or some of the coolant input port 381, the coolant output port 382, and/or the coolant drain port 387. Generally, the coolant input port 381, the coolant output port 382, and the coolant drain port 387 can be configured to allow coolant (e.g., liquid coolant, such as liquid antifreeze) to pass to and from an internal coolant chamber of the heatsink 200. Incidentally, in operation, the coolant input port 381 and the coolant output port 382 can be connected to respective coolant conduits (e.g., hoses) and the coolant drain port 387 can be plugged. The coolant can be caused to circulate from the coolant input port 381 to and through the coolant chamber of the heatsink 200 and then to the coolant output port 382 for output from the heatsink 200.

The heatsink 200 can extend through an inner volume of the cage assembly 510. More specifically, the heatsink 200 can extend transversely through inner volumes of the cage 350 and the cages 550, such as shown in FIG. 5. Moreover, the heatsink 200 can extend from the first end 512 of the cage assembly 510 to the second end 514 of the cage assembly 510. According to one or more embodiments, the heatsink 200 may extend outward past the first end 512 and/or the second end 514 of the cage assembly 510. In this regard, opposite ends of the heatsink 200 can be mechanically fixed to the first end plate 380 and/or the second end plate 386. The opposite ends of the heatsink 200 can be mechanically fixed to the first end plate 380 and/or the second end plate 386 via friction stir welding, for instance. According to one or more embodiments, the heatsink 200 may not be connected to or directly supported by the cage assembly 510. Rather, in such embodiments the first end plate 380 and/or the second end plate 386 can support the heatsink 200.

Additional components can be provided inside the cage assembly 510. Among other components, internal components of the cage assembly 510 can include one or more power modules 170 in each of cage 350, 550, power buses (e.g., AC busbars, DC busbars), circuit boards (e.g., gate drive PCB, interface PCB, high voltage PCB), wiring, transducers, temperature sensors, etc.

Figure 6:
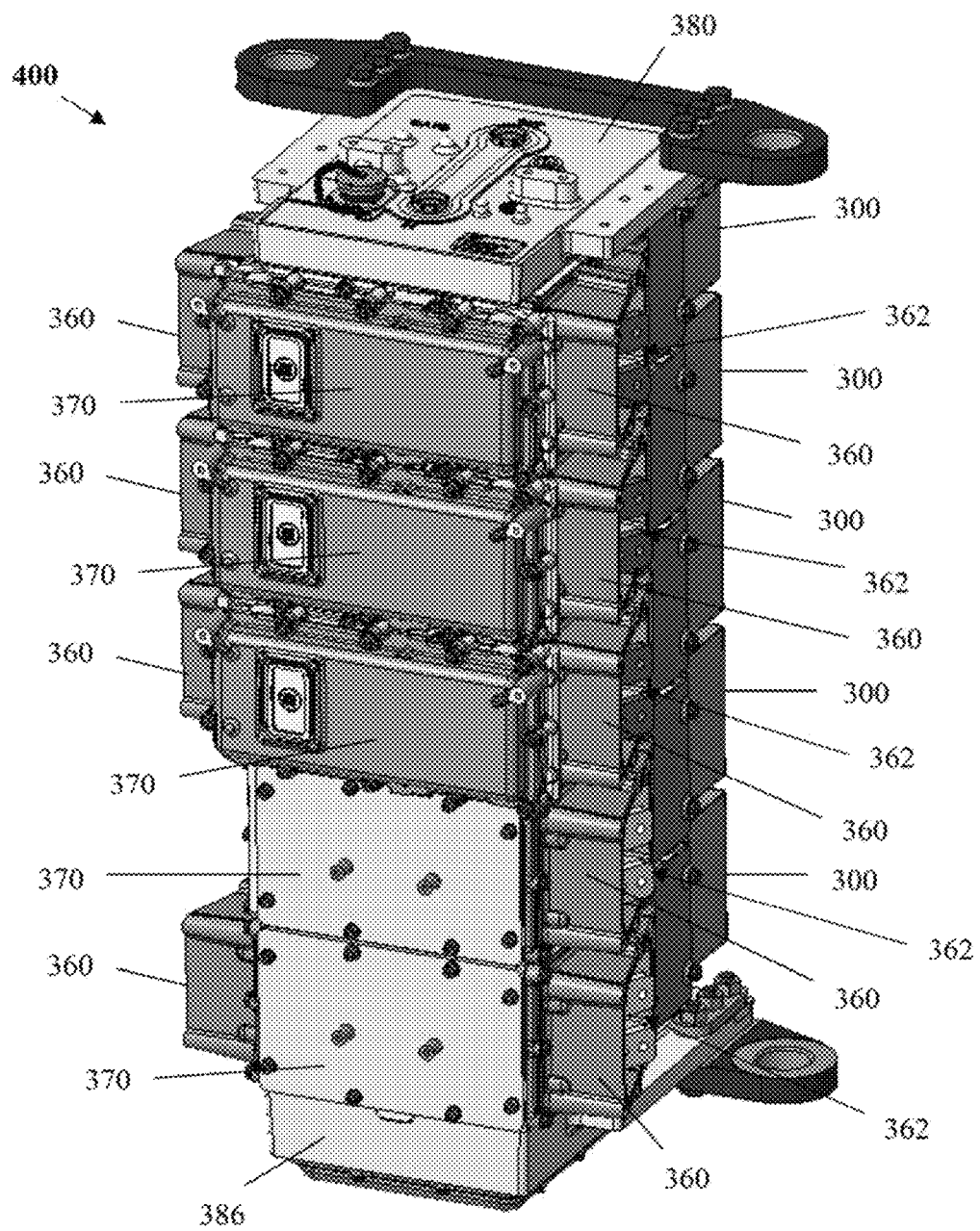
FIG. 6 shows an inverter assembly or arrangement according to one or more embodiments of the disclosed subject matter in a vertical orientation.

FIG. 6 shows an inverter arrangement or assembly 400 according to one or more embodiments of the disclosed subject matter. Inverter assembly 400 can be formed from the cage assembly 410 discussed above for FIG. 4. Moreover, inverter assembly 400 can be representative of inverter assembly 110-15 discussed above with respect to FIG. 2H.

Notably, the inverter assembly 400 can have or otherwise be provided with a plurality of capacitors 300. The capacitors 300 can be mechanically fixed (and optionally sealingly fixed) at a rear side (according to the view of FIG. 6) of the inverter assembly 400 so as to extend or project from the underlying cage assembly 410. According to one or more embodiments, the capacitors 300 can be provided on a per-cage basis. For instance, one or more capacitors 300 can be mechanically fixed (and optionally sealingly fixed) exclusively to a particular one of the cages. Optionally, a capacitor 300 can be provided for each window or opening provided at the rear side of the underlying cage 350.

Electrical connections (e.g., terminals or leads) of the capacitors 300 can extend into the inner volume of their respective cages 350. Thus, according to one or more embodiments of the disclosed subject matter, each capacitor 300 may be electrically provided only for electrical components of the corresponding cage (though embodiments of the disclosed subject matter are not so limited). To be clear, each cage 350 can have more than one capacitor 300 mechanically coupled thereto. Thus, on a per cage basis, each cage 350 can have mechanically fixed thereto only one capacitor 300 or multiple capacitors 300.

In addition to the first end plate 380 and the second end plate 386, the inverter assembly 400 can include a plurality of power connection interface covers or panels 360. The power connection interface panel 360 can include one or more electrical connection terminals or contacts 362. As an example, the electrical connection terminals 362 may be characterized or operative as phase cable connections. Such electrical connection terminals 362 can constitute output terminals 134 of the inverter assembly 400 and can lead to the second power link 114.

The power connection interface covers 360 can be mechanically fixed (and optionally sealingly fixed) to underlying cages 350 of the underlying cage assembly 410 of the inverter assembly 400. According to one or more embodiments, the power connection interface covers 360 can be provided on a per-cage basis per side of the cage assembly 410. Moreover, though the inverter assembly 400 can have cages 350 having the same size, for inverter assemblies having cages of difference sizes, the power connection interface covers 360 can be sized to cover the particular opening for the size of cage.

Optionally, the power connection interface covers 360 can be grouped according to sets. For instance, as shown in FIG. 6, a first set of power connection interface covers 360 can be provided on one side of the inverter assembly 400 (left side in the orientation of FIG. 6) and a second set of power connection interface covers 360 can be provided on another side of the inverter assembly 400 opposite the one side associated with the first set (right side in the orientation of FIG. 6).

The inverter assembly 400 can also include a plurality of panel arrangements 370. The panel arrangements 370 can be mechanically fixed (optionally sealingly fixed) to underlying cages 350 of the cage assembly 410 of the inverter assembly 400. The configuration of the panel arrangements 370, which may be homogenous or heterogenous (such as shown in FIG. 6), can be based on the overall power configuration and/or arrangement of the internal components of the inverter assembly 400. For instance, some or all of the panel arrangements 370 can include a control interface to electronically control operation of the inverter assembly 400. In one or more embodiments, the panel arrangements 370 can be provided on a side of the inverter assembly 400 opposite the capacitors 300, such as shown in FIG. 6. Though the inverter assembly 400 has cages 350 having the same size, for inverter assemblies having cages of difference sizes, the panel arrangements 370 can be sized to cover the particular opening for the size of cage.

As noted above, the arrangement of the capacitor(s) 300, the panel arrangement(s) 370, and the power connection interface cover(s) 360 can be different than as shown in FIG. 6, and may be specific to the particular inverter assembly 110. For instance, according to one or more embodiments the capacitor(s) 300 and the power connection interface cover(s) 360 can be on opposite sides of each cage or each cage assembly, and panel arrangement(s) 370 can be on the remaining opposite sides of each cage or each cage assembly.

INDUSTRIAL APPLICABILITY

As noted above, present disclosure relates to electrical inverters, particularly modular inverters, and systems, components, and methods thereof. Embodiments of the disclosed subject matter can involve some or all of individual blocks or cages, such as cages 150, 350, 550, cage assemblies, such as cage assemblies 410, 510, and inverter assemblies, such as inverter assemblies 110, 400, 500.

Embodiments of the disclosed subject matter can use a building block approach based on modular cages (e.g., cages 150, 350, 550) to mix and match such cages and one or more power modules 150 provided in each of the cages to create an inverter assembly (e.g., 110, 400, 500) to configure the inverter assembly according to requisite power and space requirements for a particular application. As noted above, however, inverter assemblies 110 according to embodiments of the disclosed subject matter can include only one cage (e.g., 150, 350, 550). Mounting orientation of the inverter assembly 110, 400, 500, i.e., either horizontal or vertical, can be based on available mounting space (e.g., oriented vertically to fit between two ripper arms of a tractor).

The cages 150, 350, 550 can be configured to couple with a power stage layout of the inverter assembly 110, 400, 500. According to embodiments of the disclosed subject matter, such a configuration can provide power to flow from or to three of six sides or faces of the inverter assembly 110, 400, 500. As discussed above, power can flow from or to the inverter assembly 110, 400, 500 via electrical connection terminals 362 of power connection interface panels 360 mechanically fixed to the respective cages 150, 350, 550 of the cage assemblies 410, 510. Hence, such configuration can provide flexibility to integrate a variety of applications without the need for or with minimal need for new components, development, or validation effort.

Generally, size and configuration of inverter assemblies according to embodiments of the disclosed subject matter can be based on one or more variables, such as type(s) of electrical load (e.g., electrical machines, such as electric generators or electric motors), total number of electrical loads, number of phases for each electrical load, how much power is needed (e.g., power per phase), overall power classification, etc.

Figure 7:
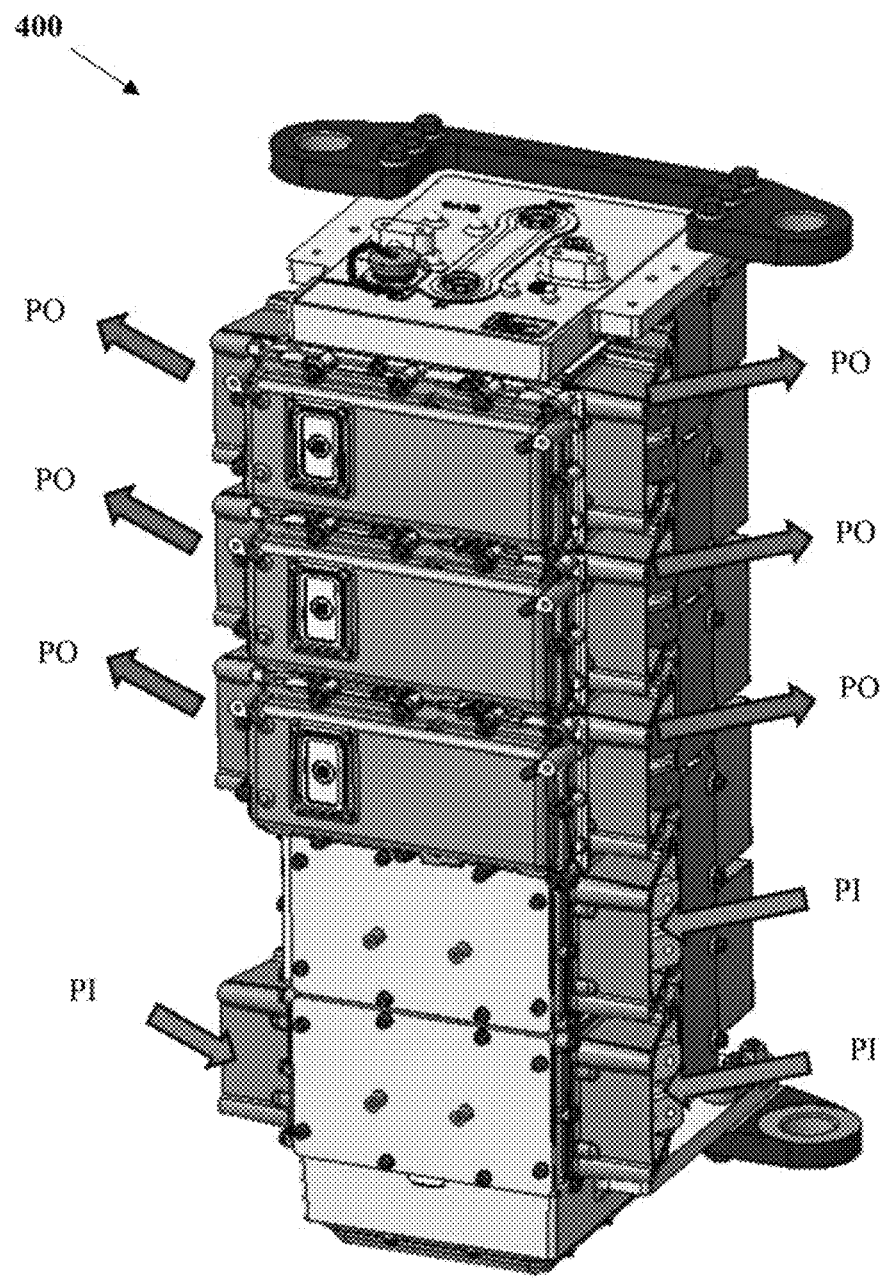
FIG. 7 shows, diagrammatically, exemplary operation of the inverter assembly or arrangement of FIG. 6 according to embodiments of the disclosed subject matter.

FIG. 7 shows, diagrammatically, exemplary operation of the inverter assembly 400. Generally, the arrows represent power being output or provided to the inverter assembly 400.

In this example, the arrows PI represent power coming into the inverter assembly 400 from a power source (e.g., generator, battery(ies), fuel cell(s), electrical grid). Here, the three PI arrows can represent three phases of input power provided to the inverter assembly 400. Therefore, in this example the PI can have associated therewith two cages 350 (i.e., the bottom two in this orientation) and corresponding power modules 170. Note also that though FIG. 7 shows single arrows for PI, the PI may be representative of one or more PI signals per phase, depending upon whether the corresponding power module 170 is the SP power module 170, the DP power module 170, or the TP power module 170.

The PO arrows being output from the left of the inverter assembly 400 can be representative of providing power to a single electrical load, such as a single electric motor. Likewise, the PO arrows being output from the right of the inverter assembly 400 can be representative of providing power to another single electrical load, such as another single electric motor. Alternatively, the electrical load can receive PO signals from both sides of the inverter assembly 400. For instance, the top two PO signals on the left and the top PO signal on the right of the inverter assembly 400 can be provided to one electrical load (e.g., one electric motor), and the remaining PO signals can be provided to another electrical load (e.g., another electric motor). Thus, an electrical load (e.g., an electric motor) can receive power from power modules 170 associated with a single side or both sides of the inverter assembly 400, depending upon the arrangement of the power modules 170 in the inverter assembly 400. Therefore, PO signals for different loads (e.g., electric motors) can be output from common cages 350 according to some embodiments of the disclosed subject matter. Note also that the three PO arrows per electrical load can represent three phases of output power provided to the corresponding electrical load (e.g., a three-phase electric motor). Additionally, though FIG. 8 shows single arrows for each PO, each PO arrow may be representative of one or more PO signals per phase, depending upon whether the corresponding power module 170 is the SP power module 170, the DP power module 170, or the TP power module 170.

The arrangement of the power modules 170 and corresponding power inputs/outputs PI/PO can be to keep connections for a common electrical load (e.g., an electric machine, such as an electric motor or electric generator) relatively close to each other. This can reduce wire routing/harness complexity and/or provide suitable Electromagnetic Compatibility (EMC) for the particular inverter assembly.

While aspects of the present disclosure have been particularly shown and described with reference to the embodiments above, it will be understood by those skilled in the art that various additional embodiments may be contemplated by the modification of the disclosed machines, assemblies, systems, and methods without departing from the spirit and scope of what is disclosed. Such embodiments should be understood to fall within the scope of the present disclosure as determined based upon the claims and any equivalents thereof.

The invention claimed is:

1. A modular configurable inverter assembly for a power system comprising:
   a cage assembly formed of at least two cages sealingly fixed to each other side-by-side in a row so as to define a first end of the cage assembly and a second end of the cage assembly opposite the first end, each of the at least two cages being in the form of a rectangular cuboid, where lengths of the at least two cages run parallel to each other and a length of the cage assembly is perpendicular to the lengths of the at least two cages;
   a heatsink extending transversely through an inner volume of each of the at least two cages, from the first end of the cage assembly to the second end of the cage assembly;
   a first set of one or more power modules operatively provided in a first cage of the at least two cages; and
   a second set of one or more power modules operatively provided in a second cage of the at least two cages,
   wherein the one or more power modules of the first set and the one or more power modules of the second set are mechanically fixed to the heatsink, and
   wherein the heatsink has a body that is planar, a width of the body extending in a width direction of the cage assembly and a thickness of the body extending in a height direction of the cage assembly.

2. The modular configurable inverter assembly according to claim 1, wherein the first cage and the second cage have the same dimensions.

3. The modular configurable inverter assembly according to claim 1, wherein the first cage and the second cage have different widths but the same length and height.

4. The modular configurable inverter assembly according to claim 1, wherein the at least two cages include at least three cages sealingly fixed to each other side-by-side in the row.

5. The modular configurable inverter assembly according to claim 1, wherein the first set of one or more power modules includes multiple power modules and/or the second set of one or more power modules includes multiple power modules.

6. The modular configurable inverter assembly according to claim 1, further comprising:
   a first end plate sealingly fixed to the first end of the cage assembly; and
   a second end plate sealingly fixed to the second end of the cage assembly,
   wherein coolant input and output ports are provided at the first end plate.

7. The modular configurable inverter assembly according to claim 1, wherein the modular configurable inverter assembly is configurable by way of a number of the cages of the cage assembly and respective numbers of the one or more power modules of the first and second sets of power modules to provide any one of the power arrangements: 2 over 1, 2 over 2, 3 over 3, 4 over 4, 5 over 4, 6 over 3, 6 over 6, 8 over 7, 9 over 9, or 10 over 8.

8. The modular configurable inverter assembly according to claim 1, further comprising:
   a plurality of capacitors sealingly fixed to the at least two cages on a per-cage basis on a first side of the cage assembly;

a plurality of panel arrangements sealingly fixed to respective ones of the at least two cages on a second side of the cage assembly; and a set of power connection interface panels sealingly fixed to respective ones of the at least two cages on a third side of the cage assembly and/or on a fourth side of the cage assembly.

9. The modular configurable inverter assembly according to claim 1, wherein the cage assembly is adapted to be mounted horizontally or vertically on a working machine.

10. A method regarding a modular power inverter comprising:

providing a cage assembly formed of at least two cages mechanically fixed to each other side-by-side in a row so as to define a first end of the cage assembly and a second end of the cage assembly opposite the first end, each of the at least two cages being in the form of a rectangular cuboid, where lengths of the at least two cages run parallel to each other and a length of the cage assembly is perpendicular to the lengths of the at least two cages;

providing a heatsink extending transversely through an inner volume of each of the at least two cages, from the first end of the cage assembly to the second end of the cage assembly;

providing a first set of one or more power modules operatively provided in a first cage of the at least two cages; and providing a second set of one or more power modules operatively provided in a second cage of the at least two cages, wherein the one or more power modules of the first set and the one or more power modules of the second set are mechanically fixed to the heatsink.

11. The method according to claim 10, wherein said providing configures the modular power inverter to provide any one of the power arrangements: 2 over 1, 2 over 2, 3 over 3, 4 over 4, 5 over 4, 6 over 3, 6 over 6, 8 over 7, 9 over 9, or 10 over 8.

12. The method according to claim 10, wherein said providing the cage assembly includes providing at least three cages mechanically fixed to each other side-by-side in the row.

13. The method according to claim 10, wherein the first set of one or more power modules includes multiple power modules and/or the second set of one or more power modules includes multiple power modules.

14. The method according to claim 10, further comprising:

providing a first end plate sealingly fixed to the first end of the cage assembly; and providing a second end plate sealingly fixed to the second end of the cage assembly, wherein coolant input and output ports are provided in the first end plate.

15. An inverter arrangement comprising:

a cage assembly including at least a first cage and a second;

a heatsink extending transversely through said first cage and said second cage, from a first end of the cage assembly to a second end of the cage assembly opposite the first end;

a first end cap provided at the first end of the cage assembly; and a second end cap provided at the second end of the cage assembly, wherein each of said first cage and said second cage is in the form of a cuboid, and wherein each of said first cage and said second cage is adapted to accommodate respectively therein at least a first power module and a second power module.

16. The inverter arrangement according to claim 15, wherein said first cage and said second cage are adapted to be mechanically coupled side-by-side to form a row of said cages for the cage assembly, wherein one of said first cage and said second cage defines a first inner volume and another of said first cage and said second cage defines a second inner volume greater than the first inner volume.

17. The inverter arrangement according to claim 15, further comprising:

a capacitor adapted to be mechanically coupled to one of said first cage and said second cage so as to extend therefrom.

18. The inverter arrangement according to claim 15, wherein the cage assembly is sealed from water and dust entering an internal volume of the cage assembly.

19. The inverter arrangement according to claim 15, further comprising said first power module and said second power module, wherein said first power module and said second power module are mechanically coupled to the heatsink, and wherein the cuboid is a rectangular cuboid.

20. The inverter arrangement according to claim 15, wherein the cuboid is a rectangular cuboid, wherein the first end cap includes a coolant input port and a coolant output port, and wherein the second end cap includes a coolant drain port.

* * * * *